United States Patent [19]
McKelvey

[11] 3,945,911
[45] Mar. 23, 1976

[54] CATHODES FOR SPUTTER-COATING GLASS SHEETS OR OTHER SUBSTRATES

[75] Inventor: Harold E. McKelvey, Plymouth, Mich.

[73] Assignee: Shatterproof Glass Corporation, Detroit, Mich.

[22] Filed: Aug. 28, 1974

[21] Appl. No.: 501,175

[52] U.S. Cl. ............................................. 204/298
[51] Int. Cl.² ........................................ C23C 15/00
[58] Field of Search ........................... 204/192, 298

[56] References Cited
UNITED STATES PATENTS

| | | | |
|---|---|---|---|
| 3,617,463 | 11/1971 | Gregor et al. | 204/298 |
| 3,699,034 | 10/1972 | Lins et al. | 204/192 |
| 3,718,572 | 2/1973 | Robison et al. | 204/298 |
| 3,748,253 | 7/1973 | Provenzano et al. | 204/298 |
| 3,793,167 | 2/1974 | Glaser | 204/298 |
| 3,838,031 | 9/1974 | Snaper | 204/192 |
| 3,890,217 | 6/1975 | Burrows et al. | 204/298 |

*Primary Examiner*—G. L. Kaplan
*Assistant Examiner*—Aaron Weisstuch
*Attorney, Agent, or Firm*—William E. Nobbe

[57] ABSTRACT

A cathode for use in the sputter-coating of thin films of a selected coating material on glass sheets or other substrates. The cathode is of rectangular boxlike construction having a closed chamber therein containing a plurality of spaced partitions arranged to form a serpentine passageway through which a cooling medium is circulated. The side and end walls of the cathode defining the closed chamber extend above the top wall of said chamber and are provided with outwardly directed flanges which form a continuous rim for supporting the cathode in operative position in the coating apparatus.

5 Claims, 4 Drawing Figures

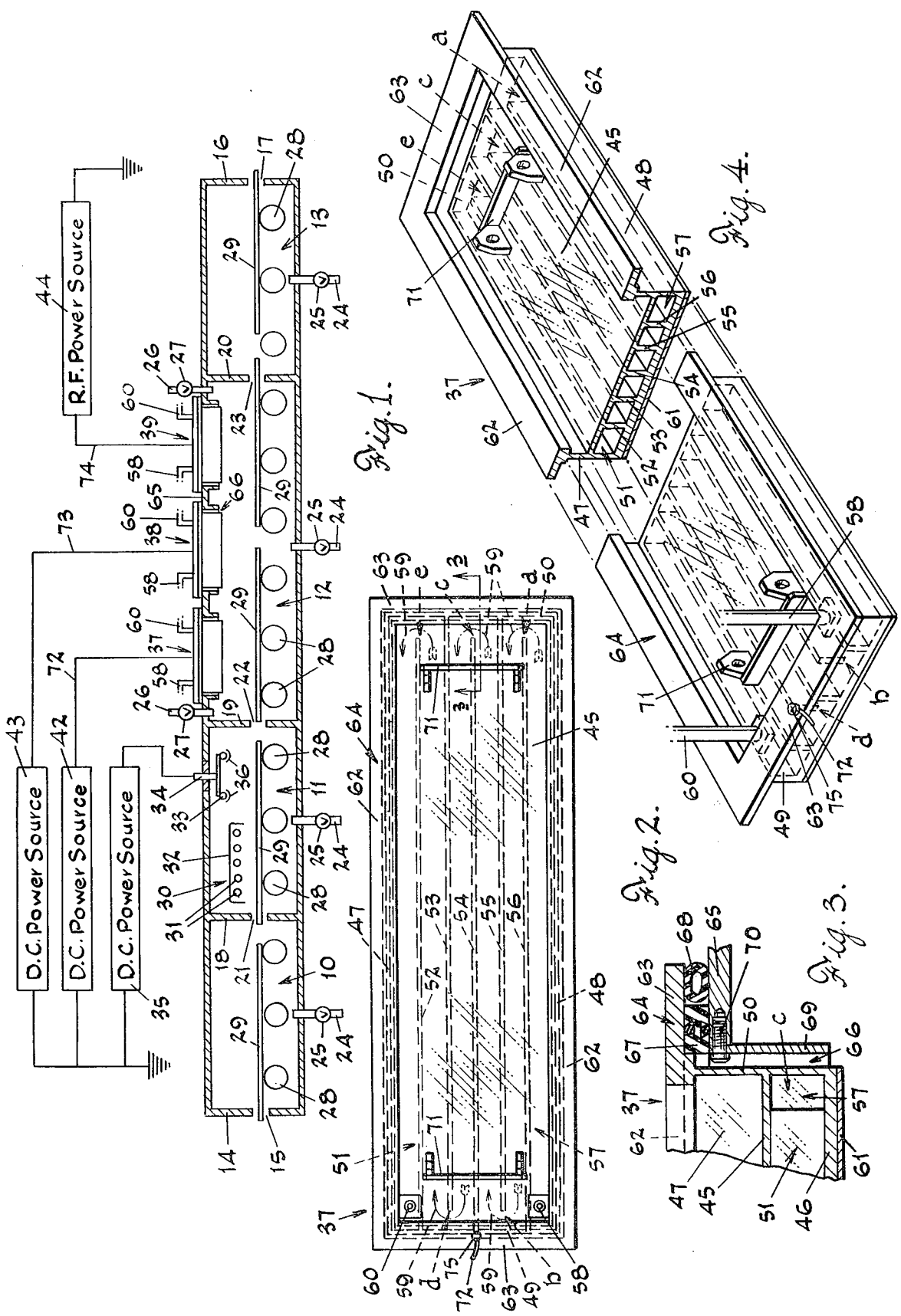

CATHODES FOR SPUTTER-COATING GLASS SHEETS OR OTHER SUBSTRATES

BACKGROUND OF THE INVENTION

The present invention relates to improvements in the coating of glass sheets or other substrates with thin films of a selected coating material and more particularly to the coating of such substrates by the cathode sputtering process.

The process of sputter-coating involves ion bombarding a target of the coating material in an ionized gas atmosphere in a chamber in which a controlled vacuum is maintained to cause atomic particles of coating material to be dislodged and deposited on the substrates to be coated. One type of apparatus employed for carrying out the process embodies a plurality of aligned, independently controlled contiguous chambers including an entry chamber, a coating chamber and an exit chamber, sputter-coating means in the form of a substantially rectangular cathode mounted horizontally in the upper portion of the coating chamber and having a sheet or layer of a selected coating material carried by the bottom surface thereof, and conveyor means for moving the substrates (glass sheets) in a horizontally disposed position through the successive chambers and beneath the sputter-coating means such that a continuous film of the selected coating material will be deposited on the upper surfaces of the substrates.

In such process, the thin films deposited on the substrates are usually of a metal such as, for example, nickel, gold, chromium, copper, molybdenum or titanium, or alloys of these metals. Typical sputtering conditions are 5,000 volts potential on the target (coating material) and a resulting current density of 0.5 to 1.0 ma/cm$^2$ for a time period of 0.2 to several minutes depending on the thickness of coating desired. It will be appreciated that this potential on the target in the ionized gas atmosphere of the coating chamber will generate a very high temperature which tends to heat the metal cathode to an undesirable degree.

In order to maintain accaptable working conditions, it is essential that the cathodes be maintained at as low a temperature as possible and to accomplish this it has been heretofore proposed to provide them with means for cooling the same during the coating operation. However, the cooling procedures heretofore utilized have not proven entirely satisfactory in meeting the requirements continuous commercial operation. Further, the mounting means previously employed for supporting the cathodes in operative position have not been of such character as to permit ready removal and replacement of the cathodes in the coating apparatus.

This invention, therefore, contemplates an improved cathode of novel design which provides a more effective and uniform cooling of the cathode and, in consequence, a more rapid and efficient dissipation of the heat generated during the sputtering process.

Another object of the invention is to provide such a cathode of simplified yet durable and sturdy construction embodying a minimum number of parts and having means for easily and quickly removing and subsequently replacing the same when it becomes necessary to change or replenish the target material.

With reference to the drawings:

FIG. 1 is a vertical longitudinal section through one form of sputter-coating apparatus with which the present invention may be employed, FIG. 2 is a plan view of the improved cathode constructed in accordance with the invention, FIG. 3 is a sectional view taken substantially on line 3—3 of FIG. 2, and FIG. 4 is a perspective view of the cathode, partially in section.

DESCRIPTION OF THE PREFERRED EMBODIMENTS

The sputter-coating apparatus illustrated in FIG. 1, with which the present invention may be employed, comprises four successive, continuous enclosures which define four independently controlled chambers — an entry chamber 10, a heating and cleaning chamber 11, a coating chamber 12 and an exit chamber 13. The chambers are rectangular in shape and the dimensions thereof, especially the height, are kept to a minimum in order to minimize the internal volume and thereby minimize the vacuum pumping required.

Each of the chambers is substantially closed except for an elongated entrance opening and an elongated exit opening. The outer end wall 14 of the entry chamber 10 is provided with an entrance opening 15, while the outer end wall 16 of exit chamber 13 is provided with a discharge opening 17. The chambers are also separated by partition walls 18, 19 and 20 provided with similiar openings 21, 22 and 23 respectively. All of the openings are positioned at the same height to allow for ingress and egress of the glass sheet substrates as they are moved into and through the successive chambers. Preferably, quick-opening and closing vacuum-tight closures are provided over at least some of the elongated openings to reduce the vacuum pumping requirements. These closures are open when a piece of glass is moved through the opening and closed when no glass is in the opening.

Each of the chambers is provided with at least one outlet tube 24, preferably located at the bottom of the chamber. Each tube communicates with a vacuum pump (not shown) and a valve 25 is provided on each tube to independently control the pressure within each of the chambers. Inlet tubes 26 extend through the top of the coating chamber and communicate with an inert gas source, preferably argon. A valve 27 is provided on each tube 26 to control the flow of gas into the coating chamber.

Conveyor means such as rollers 28 are located in the lower portion of all of the chambers to transport the substrates 29 to be coated through the sequence of chambers. The rollers are driven by suitable drive means (not shown) preferably located outside the chamber.

Heating means 30, comprising elongated, tubular radiation heaters 31, are mounted in the upper portion of the chamber 11. These heaters are preferably high-intensity radiation heaters and a reflector 32, mounted above the heaters, is used to concentrate the heat on the passing substrates 29. The substrates are heated prior to coating to promote outgassing and thereby attain additional surface cleaning and improved adherence of the coating. A glow-discharge cleaning electrode 33, in the form of a closed loop, is located at the top of chamber 11. The electrode is supported by a rod 34 and voltage is applied to the electrode by the high-voltage D.C. power source 35. One side of the source is grounded and the other side thereof is connected to the rod 34. Shields 36 are positioned below the electrode and are just large enough to prevent the substrates from "seeing" the electrode as they pass through the chamber. The electrode is operated as an ordinary sputtering electrode but the shields prevent the electrode material from being deposited on the substrates. The ionized ion of the gas will bombard the surfaces of the substrates to clean them but no sputtering is deposited.

Sputter-coating cathodes 37, 38 and 39 (to be more fully hereinafter described) are mounted at the top of the coating chamber 12. The cathodes 37 and 38 are used to deposit a thin film of a metal and therefore voltage is applied to these cathodes by high-voltage D.C. power sources 42 and 43 respectively. The cathode 39 may be used to deposit a thin protective layer of a siliceous material, such as Pyrex glass, by radio-frequency sputtering and therefore voltage is applied to cathode 39 by a high-voltage radio-frequency power source 44. All power sources are preferably grounded to the apparatus such that the apparatus will act as the anode for the cleaning and sputtering operations.

In practice, one or more cathodes may be used in the coating chamber. Several cathodes of different materials may be applied consecutively as, for example, by making cathode 37 of one metal, cathode 38 of a different metal, and cathode 39 of a siliceous material. Also, the coating chamber can be increased in length and a greater number of cathodes of the same material used to increase the deposition rate, and therefore the production rate.

In operation, the glass sheet substrates to be coated are first cleaned by a conventional washing operation and are then passed into the entry chamber 10, with the smooth continuous surface to be coated facing upward. The vacuum pumping in the entry chamber removes most of the air, moisture, and other contaminates which leak in through the entrance opening. The substrates 29 are moved by the rollers 28 into the heating and cleaning chamber 11 where they are heated by the heaters 31 and then cleaned by the cleaning electrode 33. The substrates then move at a controlled speed into the coating chamber 12 where a continuous film of the selected coating material or materials is sputtered on the clean upper surface thereof. As stated above, the cathodes 37 and 38 are preferably used to deposit a reflective film of metal, while the cathode 39 is used to radio-frequency sputter-coat an overlying layer of siliceous material, such as quartz or Pyrex. After being coated, the substrates move into the exit chamber 13 where they are cooled before being removed from the apparatus through the opening 17.

As brought out above, under typical operating conditions, 5,000 volts potential may be applied on the target (coating material) and this high potential generates an excess amount of heat that must be rapidly removed in order to produce a commercially satisfactory coating on the substrate without damage to the apparatus. The present invention is particularly concerned with the provision of a new and improved cathode of unique construction which lends itself to a more efficient and uniform cooling action such as to prevent overheating thereof during the sputtering process.

A given cooling factor may be adequate in certain instances (depending on th desired thickness of coating and speed of production) but unsatisfactory when it is desired to increase the speed of production, at which time more power is required to deposit a coating of the same thickness within the same period of time. This, of course, increases the amount of heat generated. The cathode of this invention is effective to maintain the temperature thereof within commercially acceptable limits over a wide range of operating conditions.

To this end, each of the cathodes 37, 38 and 39 is of substantially rectangular boxlike form comprising a housing including a top wall 45 and a bottom wall 46 sealed to side walls 47 and 48 and end walls 49 and 50 which define within the housing a closed chamber 51. Extending longitudinally within the chamber 51 are a plurality of spaced, parallel partitions 52,53,54,55 and 56 which divide the chamber into a series of passages. The partitions are alternately spaced from the opposite end walls 49 and 50 as indicated at $a,b,c,d$ and $e$ to provide a serpentine passageway 57 for a cooling medium, such as water. The cooling medium is introduced into one end of the passageway 57 through a supply pipe 58 and, after flowing through the serpentine passageway as indicated by the arrows 59, is discharged from the opposite end thereof through an outlet pipe 60.

The coating material (target) is carried by the under surface of the bottom wall 46 of the cathode housing and, in the case of the cathodes 37 and 38, consists of a sheet or layer 61 of a selected metal which is to be deposited upon the upper surfaces of the substrates as they pass therebeneath. As stated, various metals may be used, including chromium, nickel, tungsten, copper, gold, molybdenum and titanium, or alloys thereof. Certain of the metals, such as chromium, are applied to the bottom wall 46 by electrodeposition while others, such as gold, are brazed thereon. Other methods of application of the coating material may also be used.

The side walls 47 and 48 and end wals 49 and 50 of the cathode extend above the top wall 45 thereof and terminate in outwardly directed flanges 62 and 63 respectively to form a continuous rim 64 surrounding the housing and which serves to support the cathode in operative position.

As previously stated, one of the objects of the invention is to provide simplified means for mounting the cathodes to facilitate their ready removal and replacement whenever desired. The provision of the supporting rim 64 admirably serves this purpose. More particularly, the top wall 65 of the coating chamber 12 is provided with a transverse, rectangular opening 66 of slightly greater length and width than the cathode housing. The cathode is simply lowered into this opening so that the lower portion thereof is located within the upper portion of the coating chamber, as shown in FIG. 1. When thus positioned, the support rim 64 will overlap the adjacent portions of the top wall 65 of the coating chamber surrounding the opening 66 and will be supported thereby, as shown in FIG. 3.

To prevent electrical contact or arcing between the metal rim 64 and top wall 65 of the coating chamber, the metal rim is insulated from the coating chamber by a gasket 67 of Teflon or the like and the space between them sealed by an O-ring 68. Grounded shielding plates 69 surround the cathode within the opening in the top wall of the coating chamber and are secured to the said top wall by suitable fastening means, such as the screws 70.

With this arrangement, it is a very simple matter to remove the cathode when it is desired to replace it with another one or when the coating material has been depleted. The removal and replacement of the cathode is facilitated by the provision of brackets 71 adjacent the opposite ends thereof to which can be attached suitable lifting means.

The required electrical power for the cathodes 37, 38 and 39 can be supplied thereto from the respective power sources 42, 43 and 44 through power lines 72, 73 and 74 respectively connected to the supporting rim 64 of the respective cathode, as indicated at 75 in FIG. 4. In order to remove the cathode, it is only necessary to first disconnect the electrical power line and the means for supplying the cooling medium, whereupon the cathode can be lifted out of the opening in the top wall of the coating chamber. When installing the cathode this procedure is simply reversed. The weight of the cathode will hold it securely in place so that no additional securing means are required.

The cathode herein provided, therefore, is not only of significant importance in maintaining the cathode at an acceptable temperature under varying operating conditions but also in providing for the ready removal and replacement thereof when conditions require it.

It will be understood, of course, that the words used herein to describe the invention are words of description rather than of limitation and that the scope of the invention is to be limited only insofar as set forth in the appended claims.

I claim:

1. In combination with apparatus for sputter-coating thin films of a selected coating material on glass sheets or other substrates, a plurality of aligned, contiguous rectangular chambers, including an entry chamber, a coating chamber and an exit chamber, means for conveying the glass sheets to be coated into, through and out of the successive chambers, and a rectangular cathode arranged transversely in said coating chamber and mounted (in the opening in) adjacent the top wall thereof, said cathode comprising a housing having a top wall, a bottom wall and side and end walls defining a closed chamber, the improvement which comprises means in said closed chamber defining a serpentine passageway formed of spaced, parallel passages extending longitudinally of said chamber, said passages communicating at alternate ends with adjacent passages to form the serpentine passageway, and means for circulating a cooling medium through said passageway, said bottom wall of the cathode adapted to secure a layer of coating material thereon.

2. The improvement of claim 1, in which the means defining the serpentine passageway comprises a plurality of spaced, parallel partitions that extend longitudinally of said chamber, and in which alternate partitions terminate short of the opposite end walls of the said closed chamber.

3. In combination with apparatus for the sputter-coating of thin films of a selected coating material on glass sheets or other substrates, a plurality of aligned, contiguous rectangular chambers, including an entry chamber, a coating chamber and an exit chamber, means for conveying the glass sheets to be coated into, through and out of successive chambers, and a rectangular cathode arranged transversely in said coating chamber and comprising a rectangular housing defining a closed chamber, and means for circulating a cooling medium through said closed chamber, the improvement which consists in that the side and end walls of said rectangular housing extend upwardly beyond the top wall thereof and terminate in outwardly directed flanges which form a continuous rim encircling said housing and adapted to support the cathode in the upper portion of said coating chamber.

4. The improvement of claim 3, including a plurality of spaced parallel partitions disposed in said closed chamber extending longitudinally thereof, with alternate partitions terminating short of the opposite end walls of the said chamber to form a serpentine passageway through which the cooling medium is circulated.

5. In combination with apparatus for sputter-coating thin films of a selected coating material on glass sheets or other substrates, a plurality of aligned, contiguous rectangular chambers including an entry chamber, a coating chamber and an exit chamber, means for conveying the glass sheets to be coated into, through and out of the successive chambers, said coating chamber having a top wall provided with a substantially rectangular opening therein extending transversely thereof, a substantially rectangular cathode mounted in said opening and including a housing having a top wall, a bottom wall and side and end walls defining a closed chamber therein, and means for circulating a cooling medium through said closed chamber, the improvement which consists in that the side and end walls of the housing extend upwardly beyond the top wall thereof and terminate in outwardly directed flanges which form a continuous rim surrounding the housing, the lower portion of the cathode being received in the coating chamber and the rim thereof being supported on the adjacent portions of the top wall of the coating chamber defining the opening therein, the bottom wall of said housing adapted to secure a layer of coating material thereon.

* * * * *

UNITED STATES PATENT AND TRADEMARK OFFICE
CERTIFICATE OF CORRECTION

PATENT NO. : 3,945,911
DATED : March 23, 1976
INVENTOR(S) : Harold E. McKelvey

It is certified that error appears in the above-identified patent and that said Letters Patent are hereby corrected as shown below:

Claim 1, line 9, cancel "(in the opening in)"

Signed and Sealed this

Thirty-first Day of August 1976

[SEAL]

Attest:

RUTH C. MASON
Attesting Officer

C. MARSHALL DANN
Commissioner of Patents and Trademarks